(12) United States Patent
Rimini

(10) Patent No.: US 8,548,105 B2
(45) Date of Patent: Oct. 1, 2013

(54) JOINT TIME-FREQUENCY AUTOMATIC GAIN CONTROL FOR WIRELESS COMMUNICATION

(75) Inventor: Roberto Rimini, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 555 days.

(21) Appl. No.: 12/510,176

(22) Filed: Jul. 27, 2009

(65) Prior Publication Data

US 2010/0034327 A1 Feb. 11, 2010

Related U.S. Application Data

(60) Provisional application No. 61/086,189, filed on Aug. 5, 2008.

(51) Int. Cl.
*H04L 27/08* (2006.01)

(52) U.S. Cl.
USPC ........... 375/345; 375/316; 375/219; 375/227; 375/281; 375/130; 375/350; 375/346; 375/264; 375/222; 370/208; 370/210; 370/487

(58) Field of Classification Search
USPC ................ 375/345, 316, 219, 227, 281, 130, 375/350, 346, 264, 222; 455/232.1, 234.1, 455/296, 303; 370/208, 210, 487
See application file for complete search history.

(56) References Cited

U.S. PATENT DOCUMENTS

| 5,973,560 | A * | 10/1999 | Lee | 330/136 |
| 2002/0186799 | A1 * | 12/2002 | Sayeed | 375/345 |
| 2004/0100898 | A1 * | 5/2004 | Anim-Appiah et al. | 370/210 |
| 2005/0031057 | A1 * | 2/2005 | Messina et al. | 375/345 |
| 2005/0163095 | A1 | 7/2005 | Raleigh et al. | |
| 2006/0222118 | A1 * | 10/2006 | Murthy et al. | 375/345 |
| 2007/0254592 | A1 | 11/2007 | McCallister et al. | |
| 2008/0070534 | A1 | 3/2008 | Lai | |

FOREIGN PATENT DOCUMENTS

| CN | 1318902 A | 10/2001 |
| EP | 1137189 A2 | 9/2001 |

(Continued)

OTHER PUBLICATIONS

International Search Report and Written Opinion—PCT/US2009/052610, International Search Authority—European Patent Office—Oct. 13, 2009.

(Continued)

*Primary Examiner* — Zewdu Kassa
(74) *Attorney, Agent, or Firm* — Kenneth K. Vu; Dalei Dong

(57) ABSTRACT

Techniques for performing joint time-frequency automatic gain control (AGC) by a receiver are described. In an aspect, the receiver may transform time-domain samples with a fast Fourier transform (FFT) to obtain frequency-domain symbols and may detect for saturation of the frequency-domain symbols. The receiver may adjust a gain based on whether saturation is detected and may apply the gain prior to the FFT. In one design, the receiver may use a nominal value for a setpoint if saturation is not detected and may reduce the setpoint if saturation is detected. The receiver may adjust the gain based on the setpoint, which may determine the average power of the time-domain samples. In another design, the receiver may determine the gain based on a gain offset and may vary the gain offset based on whether saturation is detected. For both designs, the receiver may apply the gain on digital samples and/or an analog signal prior to the FFT.

28 Claims, 5 Drawing Sheets

(56) References Cited

FOREIGN PATENT DOCUMENTS

| | | | |
|---|---|---|---|
| JP | 60225279 | A | 11/1985 |
| JP | 2002353813 | A | 12/2002 |
| JP | 2004180314 | A | 6/2004 |

OTHER PUBLICATIONS

Taiwan Search Report—TW098126386—TIPO—Dec. 28, 2012.

* cited by examiner

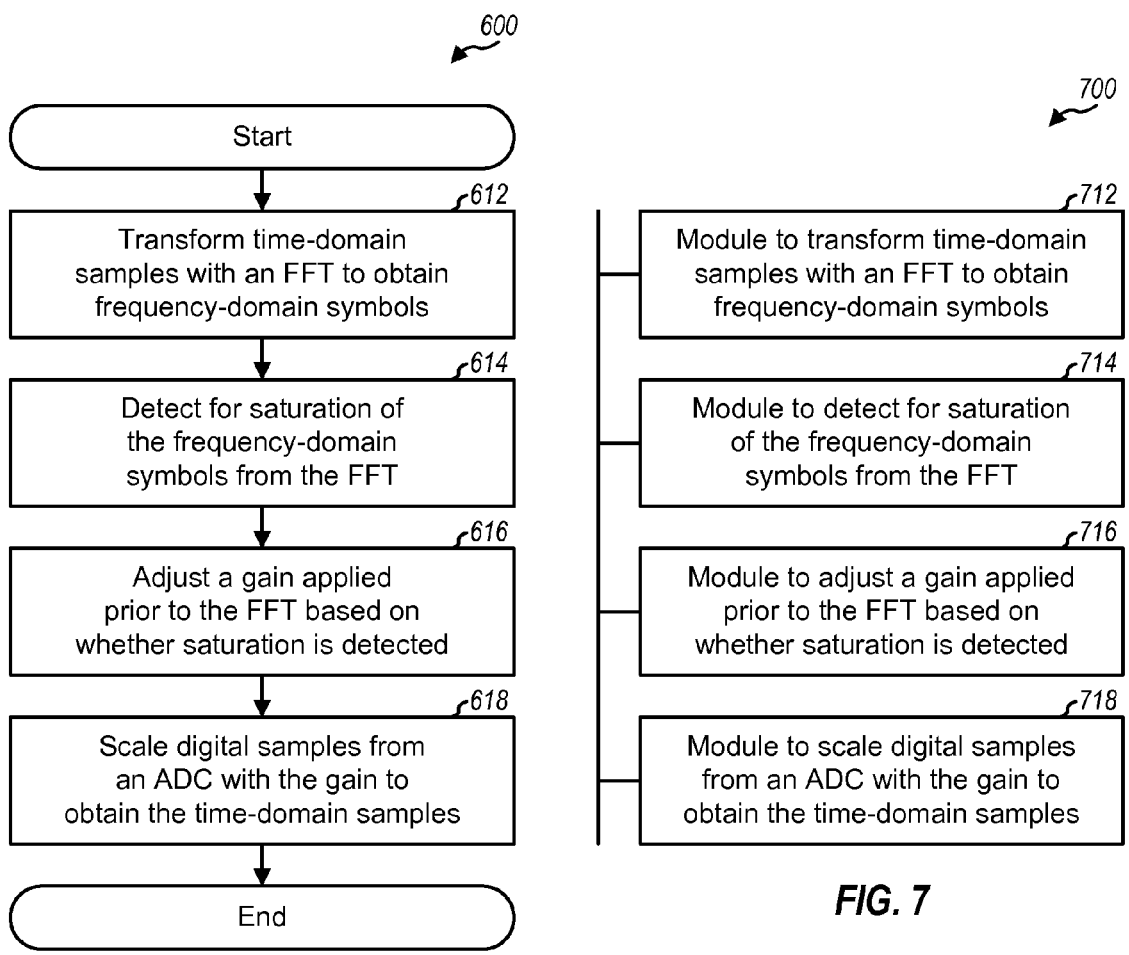

JOINT TIME-FREQUENCY AUTOMATIC GAIN CONTROL FOR WIRELESS COMMUNICATION

The present application claims priority to provisional U.S. Application Ser. No. 61/086,189, entitled "JOINT TIME-FREQUENCY AUTOMATIC GAIN CONTROL MECHANISM FOR FREQUENCY DOMAIN BASED WIRELESS SYSTEMS," filed Aug. 5, 2008, assigned to the assignee hereof and incorporated herein by reference.

BACKGROUND

I. Field

The present disclosure relates generally to communication, and more specifically to techniques for performing automatic gain control (AGC) for wireless communication.

II. Background

In a wireless communication system, a transmitter typically processes (e.g., encodes and modulates) data and generates a radio frequency (RF) modulated signal that is more suitable for transmission. The transmitter then transmits the RF modulated signal via a wireless channel to a receiver. The wireless channel distorts the transmitted signal with a channel response and further degrades the signal with noise and interference.

The receiver receives the transmitted signal, conditions the received signal to obtain a baseband signal, digitizes the baseband signal to obtain samples, and processes the samples to recover the data sent by the transmitter. The received signal level may vary over a wide range due to various channel propagation phenomena such as fading and shadowing. Hence, the receiver typically performs AGC to avoid saturation of various circuit blocks in the receiver. Saturation may occur when the input of a circuit block exceeds a maximum input signal level or the output of the circuit block exceeds a maximum output signal level. Saturation may result in distortion components that may degrade performance. Hence, it may be desirable to perform AGC in a manner to obtain good performance.

SUMMARY

Techniques for performing joint time-frequency AGC by a receiver in a wireless communication system are described herein. The receiver may be part of a user equipment (UE), a base station, etc. The receiver may perform AGC on a time-domain signal prior to performing fast Fourier transform (FFT) to transform the time-domain signal to frequency domain. The time-domain signal may be within an acceptable range of signal levels, but the output of the FFT may saturate. This may be the case, for example, if all or most of the energy of the time-domain signal is concentrated in one or few sub-carriers among a number of subcarriers.

In an aspect, the receiver may monitor the output of the FFT to detect for saturation and may adjust the operation of AGC when saturation is detected. In one design, the receiver may transform time-domain samples with an FFT to obtain frequency-domain symbols. The receiver may detect for saturation of the frequency-domain symbols and may adjust a gain applied prior to the FFT based on whether saturation is detected. In one design, the receiver may perform digital AGC (DAGC) and may scale digital samples from an analog-to-digital converter (ADC) with the gain to obtain the time-domain samples. In another design, the receiver may perform analog AGC and may apply the gain to an analog signal prior to the ADC. The receiver may also perform a combination of analog AGC and DAGC.

In one design of DAGC, the receiver may use a nominal value for a setpoint if saturation is not detected and may reduce the setpoint if saturation is detected. The setpoint may determine the average power of the time-domain samples provided to the FFT. The receiver may measure the power of the time-domain samples, determine an error between the measured power and the setpoint, and filter the error to obtain the gain. The receiver may use a nominal bandwidth for the filtering if saturation is not detected and may increase the bandwidth if saturation is detected in order to more quickly change the gain.

In another design of DAGC, the receiver may measure the power of the time-domain samples, determine an initial gain based on the setpoint and the measured power, determine a gain offset based on whether saturation is detected, and determine the gain based on the initial gain and the gain offset. The receiver may set the gain offset to a nominal value (e.g., zero) if saturation is not detected or to a negative value to reduce the gain if saturation is detected.

Various aspects and features of the disclosure are described in further detail below.

BRIEF DESCRIPTION OF THE DRAWINGS

FIG. 6 shows a process for performing joint time-frequency AGC.

FIG. 7 shows an apparatus for performing joint time-frequency AGC.

DETAILED DESCRIPTION

The techniques described herein may be used for various wireless communication systems such as cellular systems, broadcast systems, wireless local area network (WLAN) systems, etc. The terms "system" and "network" are often used interchangeably. The cellular systems may be Code Division Multiple Access (CDMA) systems, Time Division Multiple Access (TDMA) systems, Frequency Division Multiple Access (FDMA) systems, Orthogonal Frequency Division Multiple Access (OFDMA) systems, Single-Carrier FDMA (SC-FDMA) systems, etc. An OFDMA system may implement a radio technology such as Evolved Universal Terrestrial Radio Access (E-UTRA), Ultra Mobile Broadband (UMB), IEEE 802.16 (WiMAX), IEEE 802.20, Flash-OFDM®, etc. E-UTRA is part of Universal Mobile Telecommunication System (UMTS). 3GPP Long Term Evolution (LTE) and LTE-Advanced (LTE-A) are new releases of UMTS that use E-UTRA, which employs OFDMA on the downlink and SC-FDMA on the uplink. E-UTRA, UMTS, LTE and LTE-A are described in documents from an organization named "3rd Generation Partnership Project" (3GPP). UMB are described in documents from an organization named "3rd Generation Partnership Project 2" (3GPP2). The broadcast systems may be MediaFLO™ systems, Digital Video Broadcasting for Handhelds (DVB-H) systems, Integrated Services Digital Broadcasting for Terrestrial Television Broadcasting (ISDB-T) systems, etc. The WLAN systems may be IEEE 802.11 (Wi-Fi) systems, etc. The techniques described herein may be used for the systems and radio technologies mentioned above as well as other systems and radio technologies.

In general, the techniques may be used for systems with multiple subcarriers. Multiple subcarriers may be obtained with orthogonal frequency division multiplexing (OFDM), single-carrier frequency division multiplexing (SC-FDM), or some other modulation technique. OFDM and SC-FDM partition the system bandwidth into multiple ($N_{FFT}$) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers ($N_{FFT}$) may be dependent on the system bandwidth. For example, $N_{FFT}$ may be equal to 128, 256, 512, 1024 or 2048 for system bandwidth of 1.25, 2.5, 5, 10 or 20 MHz, respectively. OFDM is used in various radio technologies such as LTE, UMB, WLAN, IEEE 802.16, IEEE 802.11a/g, Flash-OFDM®, MediaFLO™, DVB-H, ISDB-T, etc. SC-FDM is used in radio technologies such as LTE.

Figure 1:
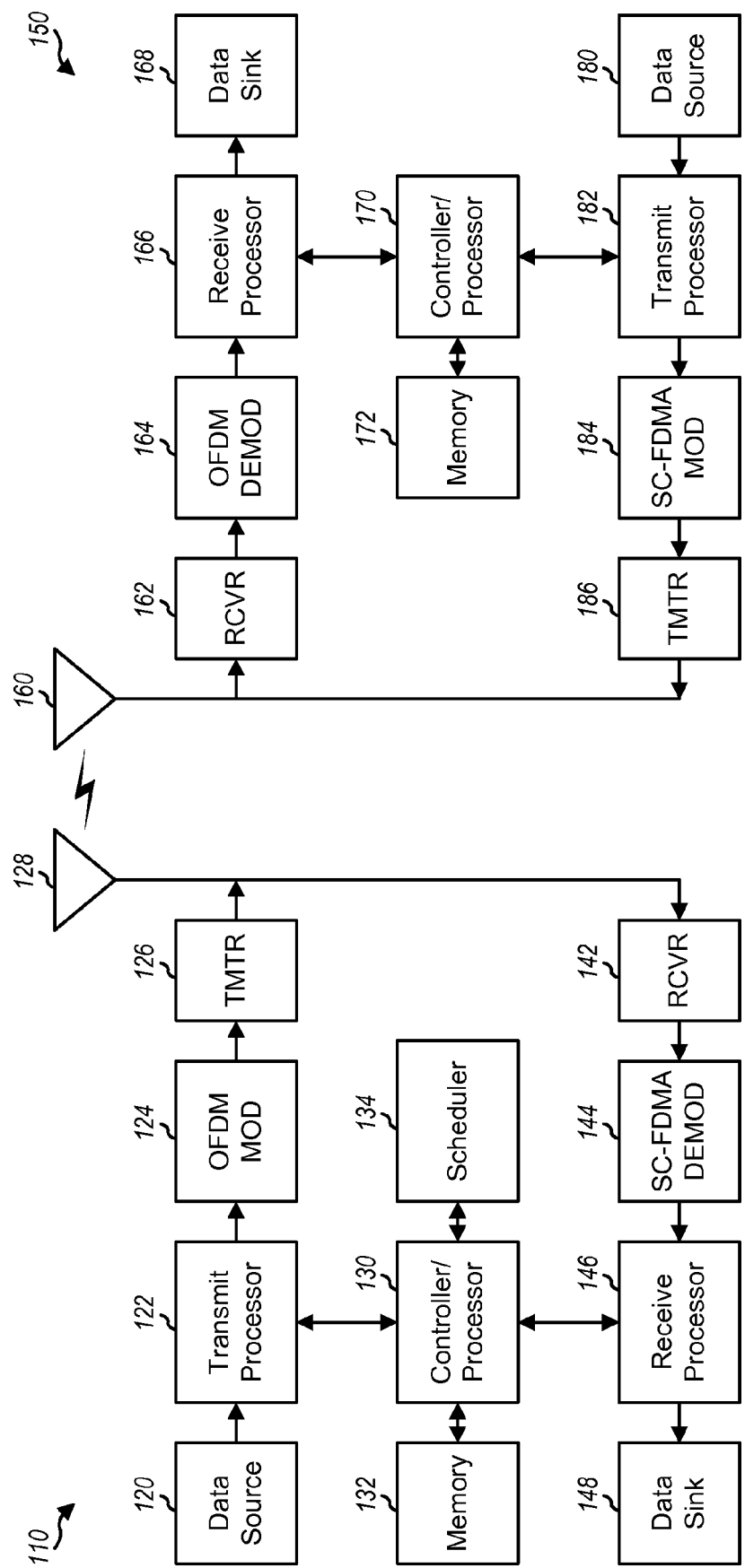
FIG. 1 shows a block diagram of a base station and a UE.

FIG. 1 shows a block diagram of a design of a base station 110 and a UE 150 in a wireless system, which may be an LTE system or some other system. A base station may be a station that communicates with the UEs and may also be referred to as a Node B, an evolved Node B (eNB), an access point, etc. A UE may also be referred to as a mobile station, a terminal, an access terminal, a subscriber unit, a station, etc. A UE may be a cellular phone, a personal digital assistant (PDA), a wireless modem, a wireless communication device, a handheld device, a laptop computer, a cordless phone, a wireless local loop (WLL) station, etc.

At base station 110, a transmit processor 122 may receive data from a data source 120 and control information from a controller/processor 130. Transmit processor 122 may process (e.g., encode and symbol map) the data and control information and obtain data symbols and control symbols. Transmit processor 122 may also generate pilot symbols and may multiplex the pilot symbols with the data symbols and the control symbols. An OFDM modulator (MOD) 124 may perform OFDM modulation on the multiplexed symbols and provide time-domain output samples. A transmitter unit (TMTR) 126 may condition (e.g., convert to analog, filter, amplify, and upconvert) the output samples and generate a downlink signal, which may be transmitted via an antenna 128.

At UE 150, an antenna 160 may receive the downlink signal from base station 110 and may provide a received signal to a receiver unit (RCVR) 162. Receiver unit 162 may process (e.g., filter, amplify, downconvert, and digitize) the received signal and provide input samples. An OFDM demodulator (DEMOD) 164 may perform OFDM demodulation on the input samples and provide received symbols. A receive processor 166 may process (e.g., detect, demodulate, and decode) the received symbols, provide decoded data for UE 150 to a data sink 168, and provide decoded control information to a controller/processor 170.

On the uplink, a transmit processor 182 at UE 150 may receive data from a data source 180 and control information from controller/processor 170. The data and control information may be processed (e.g., encoded and symbol mapped) by transmit processor 182, modulated by an SC-FDMA modulator 184, and further conditioned by a transmitter unit 186 to generate an uplink signal, which may be transmitted via antenna 160. At base station 110, the uplink signal from UE 150 may be received by antenna 128, conditioned by a receiver unit 142, demodulated by an SC-FDMA demodulator 144, and decoded by a receive processor 146. Receive processor 146 may provide decoded data to a data sink 148 and provide decoded control information to controller/processor 130.

Controllers/processors 130 and 170 may direct the operation at base station 110 and UE 150, respectively. Memories 132 and 172 may store program code and data for base station 110 and UE 150, respectively. A scheduler 134 may schedule UEs for data transmission on the downlink and/or uplink and may assign resources to the scheduled ULs.

FIG. 1 shows a design in which OFDM may be used for one link (e.g., downlink) and SC-FDMA may be used for the other link (e.g., uplink), as specified in LTE. In general, OFDM may be used for one link, or both links, or neither link of a wireless system. Similarly, SC-FDMA may be used for one link, both links, or neither link.

Figure 2:
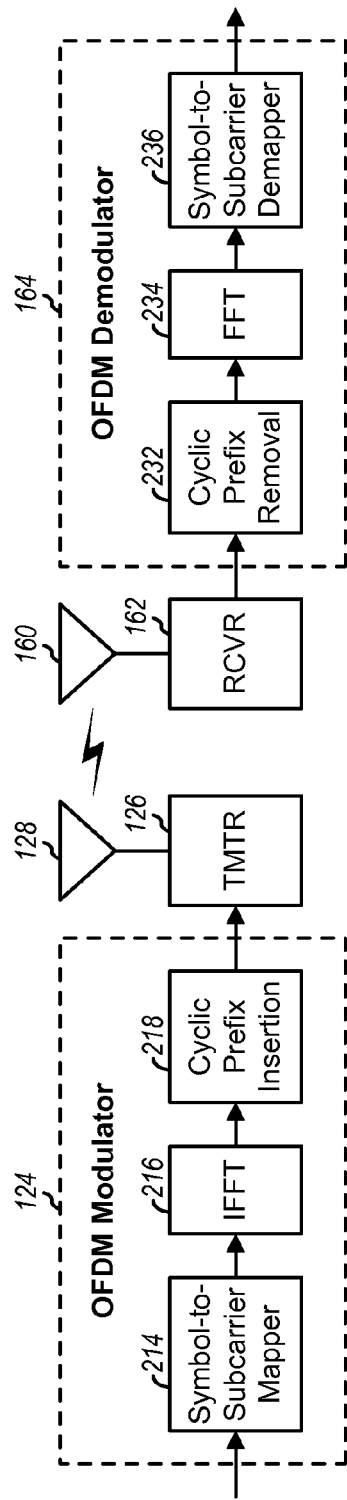
FIG. 2 shows an OFDM modulator and an OFDM demodulator.

FIG. 2 shows a block diagram of a design of OFDM modulator 124 and OFDM demodulator 164 in FIG. 1. Within OFDM modulator 124, a symbol-to-subcarrier mapper 214 may receive output symbols from transmit processor 122, map the output symbols to subcarriers used for transmission, and map zero symbols with signal value of zero to the remaining subcarriers. An inverse fast Fourier transform (IFFT) unit 216 may receive $N_{FFT}$ symbols for the $N_{FFT}$ total subcarriers in one OFDM symbol period, transform the $N_{FFT}$ symbols to the time domain with an $N_{FFT}$-point IFFT, and provide a useful portion comprising $N_{FFT}$ time-domain output samples. In the description herein, the term "IFFT" generically refers to any function that can transform data from time domain to frequency domain. Each output sample may be a complex value to be sent in one sample period. A cyclic prefix insertion unit 218 may copy the last $N_{CP}$ output samples of the useful portion and append the copied samples to the front of the useful portion to form an OFDM symbol comprising $N_{FFT}+N_{CP}$ output samples. The repeated portion may be referred to as a cyclic prefix or a guard interval, and $N_{CP}$ is the cyclic prefix length. The cyclic prefix is used to combat inter-symbol interference (ISI) caused by frequency selective fading, which is a frequency response that varies across the system bandwidth. Transmitter unit 126 may process and transmit the OFDM symbol in one OFDM symbol period (or simply, one symbol period), which may cover $N_{FFT}+N_{CP}$ sample periods.

Receiver unit 162 may process a received signal and provide input samples to OFDM demodulator 164. Within OFDM demodulator 164, a cyclic prefix removal unit 232 may obtain $N_{FFT}+N_{CP}$ input samples in one OFDM symbol period, remove $N_{CP}$ input samples for the cyclic prefix, and provide $N_{FFT}$ input samples. A fast Fourier transform (FFT) unit 234 may transform the $N_{FFT}$ input samples to the frequency domain with an $N_{FFT}$-point FFT and provide $N_{FFT}$ received symbols for the $N_{FFT}$ total subcarriers. In the description herein, the term "FFT" generically refers to any function that can transform data from the frequency domain to the time domain. A symbol-to-subcarrier demapper 236 may obtain $N_{FFT}$ received symbols, provide received symbols from subcarriers used for transmission to receive processor 166, and discard the remaining received symbols.

Figure 3:
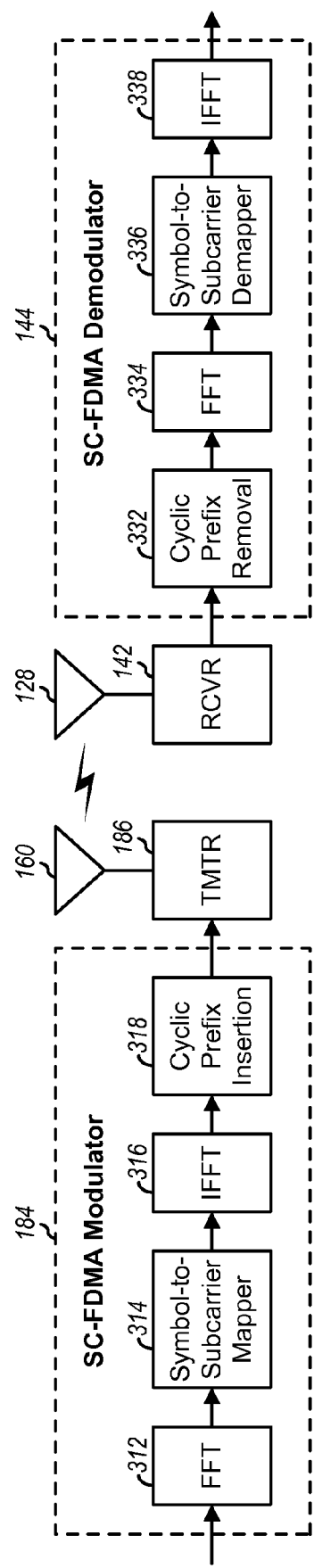
FIG. 3 shows an SC-FDMA modulator and an SC-FDMA demodulator.

FIG. 3 shows a block diagram of a design of SC-FDMA modulator 184 and SC-FDMA demodulator 144 in FIG. 1. Within SC-FDMA modulator 184, an FFT unit 312 may receive N output symbols to be sent in one SC-FDMA symbol period, transform the N output symbols to the frequency domain, and provide N frequency-domain symbols. A symbol-to-subcarrier mapper 314 may map the N frequency-domain symbols to N subcarriers used for transmission, map zero symbols to the remaining subcarriers, and provide $N_{FFT}$ output symbols. An IFFT unit 316 may transform the $N_{FFT}$ output symbols to the time domain and provide a useful portion comprising $N_{FFT}$ output samples. A cyclic prefix insertion unit 318 may append a cyclic prefix to the useful portion and provide an SC-FDMA symbol comprising $N_{FFT}+N_{CP}$ output samples.

Within SC-FDMA demodulator 144, a cyclic prefix removal unit 332 may obtain $N_{FFT}+N_{CP}$ input samples in one SC-FDMA symbol period, remove $N_{CP}$ input samples for the cyclic prefix, and provide $N_{FFT}$ input samples. An FFT unit 334 may transform the $N_{FFT}$ input samples to the frequency domain and provide $N_{FFT}$ received symbols for the $N_{FFT}$ total subcarriers. A symbol-to-subcarrier demapper 336 may provide N frequency-domain symbols from the N subcarriers used for transmission and discard the remaining frequency-domain symbols. An IFFT unit 338 may transform the N frequency-domain symbols to the time domain and provide N received symbols to receive processor 146 for further processing.

Base station 110 and UE 150 may each perform AGC in its receiver in order to obtain samples at a desired signal level and to avoid saturation of circuit blocks in the receiver. The terms "saturation" and "clipping" are often used interchangeably. AGC may be performed in different manners depending on various factors such as the design of the receiver. AGC may comprise analog AGC and/or digital AGC (DAGC). Analog AGC refers to AGC prior to an ADC and may be used to compensate for pathloss attenuation and, to a certain degree, fading fluctuations that may produce large variations in signal level. DAGC refers to AGC after the ADC and may be used to compensate for variations in signal level not corrected by analog AGC.

Whether to perform analog AGC and/or DAGC may be dependent on the capabilities of the ADC. For example, the ADC may have a large dynamic range (e.g., up to 16 bits of dynamic range) and may be able to accommodate wide variations in the received signal level. In this case, it may be possible to omit analog AGC and provide a received baseband signal directly to the ADC. The ADC may then provide samples with values within its large dynamic range. Although the ADC may be left "unprotected", the signal level at the input of a subsequent receive processor or modem should be scaled appropriately in order to meet a constant power level requirement regardless of the received signal levels at the receiver and the ADC. DAGC may be used to ensure a constant average power level at the input of the receive processor and may compensate for large-scale slow fading fluctuations produced by shadowing.

Figure 4:
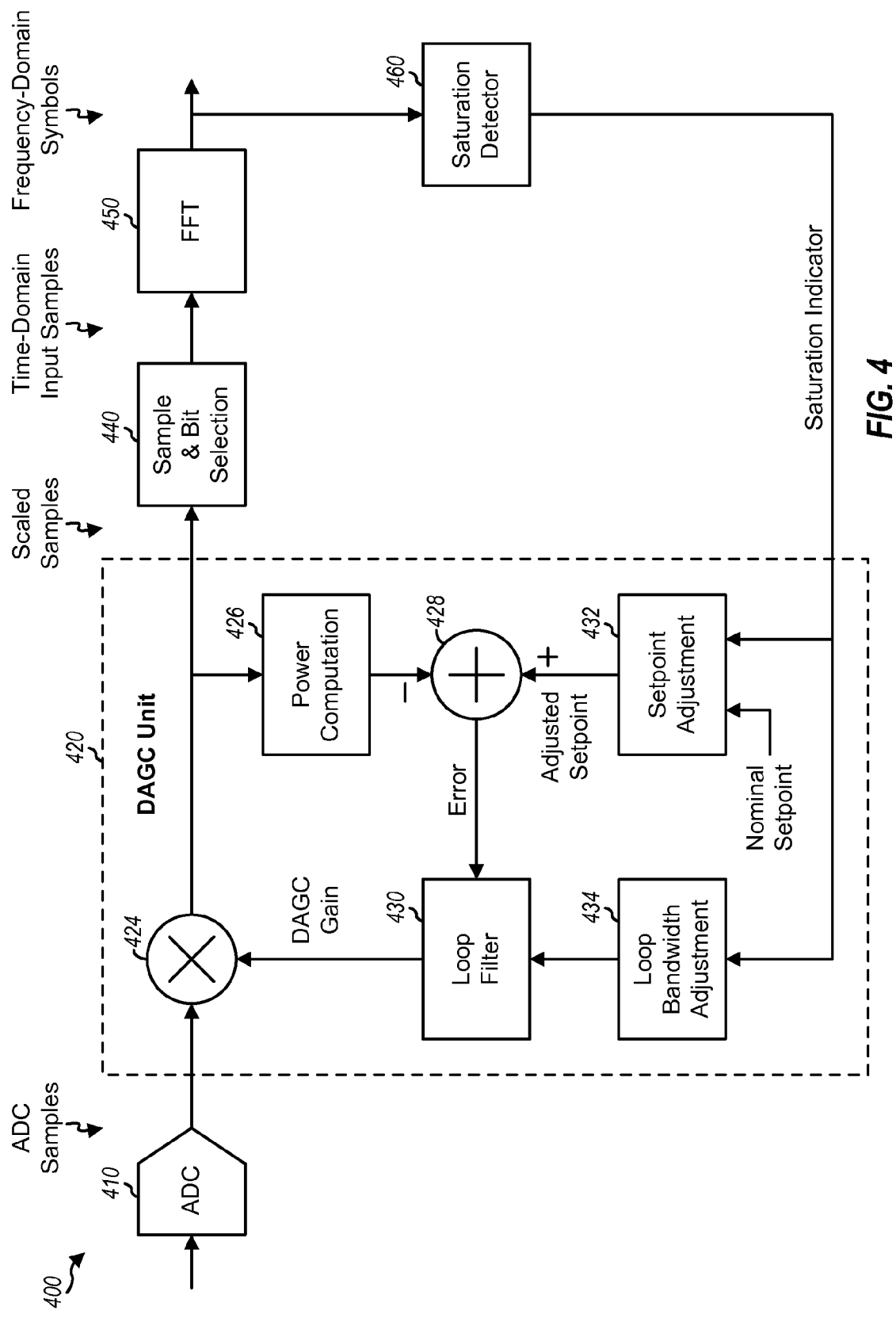
FIG. 4 shows a receiver with joint time-frequency AGC.

FIG. 4 shows a block diagram of a design of a receiver 400 for an OFDM-based or SC-FDMA-based transmission. Receiver 400 may include a portion of receiver unit 162 and OFDM demodulator 164 at UE 150 or a portion of receiver unit 142 and SC-FDMA demodulator 144 at base station 110 in FIG. 1.

Within receiver 400, an ADC 410 may digitize a received baseband signal and provide ADC samples having a wide range of values depending on the signal level of the received baseband signal. A DAGC unit 420 may scale the ADC samples and provide scaled samples. A sample and bit selection unit 440 may remove the cyclic prefix of a received OFDM symbol or a received SC-FDMA symbol. Selection unit 440 may also extract an appropriate subset of bits in the scaled samples based on their values and provide input samples comprising the selected subset of bits to an FFT unit 450. FFT unit 450 may transform the input samples to the frequency domain and provide frequency-domain symbols for the $N_{FFT}$ total subcarriers. FFT unit 450 may correspond to FFT unit 234 in FIG. 2 or FFT unit 334 in FIG. 3.

DAGC unit 420 may provide scaled samples within an appropriate signal range in order to exploit the full dynamic range of FFT unit 450. The gain of DAGC unit 420 (or the DAGC gain) may be adjusted based on a setpoint to ensure correct bit-width selection without clipping of a time-domain signal comprising the input samples. However, even if the time-domain signal is well below a saturation threshold, one or more frequency-domain symbols from FFT unit 450 for one or more subcarriers may saturate to a maximum value for the FFT unit.

The frequency-domain symbols from FFT unit 450 may saturate even though the time-domain input samples provided to FFT unit 450 may not be saturated. This phenomenon may be due to an inherent discrepancy in scaling a signal in the time domain through time-domain DAGC and projecting the signal energy in the frequency domain by means of an FFT. This phenomenon may occur when all or most of the energy of an OFDM symbol or an SC-FDMA symbol is concentrated in one or few subcarriers. This phenomenon may occur in various operating scenarios. For example, on the uplink in LTE, only few subcarriers may be assigned to a given UE, and only few UEs may be present. In this case, the power spectral density (PSD) of the few subcarriers assigned to the UE may be large as a consequence of total energy conservation in both time domain and frequency domain. These high-power spectral components may saturate the finite dynamic range of the FFT unit, which may then generate severe signal distortion.

The problem of saturation in the frequency domain without saturation in the time domain may be addressed by reducing the DAGC gain all the time by a suitable power back-off. The lower DAGC gain would reduce the time-domain signal level, which would then reduce the signal level of the frequency-domain symbols by a corresponding amount. However, reducing the DAGC gain would trade off dynamic range for quantization noise. Furthermore, reducing the DAGC gain would effectively reduce the dynamic range of the FFT unit and introduce a higher noise floor at the FFT output, which may reduce the maximum signal-to-noise ratio (SNR) of the receiver and consequently the peak data rate supported by the receiver. Thus, reducing the DAGC gain all the time to combat potential saturation in the frequency domain may degrade performance much of the time when there is no saturation.

In an aspect, joint time-frequency AGC may be performed to combat saturation in the frequency domain if and when saturation does occur. The output of the FFT unit may be monitored to detect for saturation. When saturation is detected, feedback information may be provided from the FFT output to inform the DAGC unit about saturation in the frequency domain. The DAGC unit may then perform appropriate corrective action (e.g., reduce the DAGC gain) upon receiving the feedback information.

FIG. 4 shows a block diagram of a design of DAGC unit 420 for joint time-frequency AGC. Within DAGC unit 420, a multiplier 424 may multiply each ADC sample with the DAGC gain and provide a corresponding scaled sample. A power computation unit 426 may compute the power of each scaled sample as $P=I^2+Q^2$, where I is an inphase component of the sample, Q is a quadrature component of the sample, and P is the power of the sample. The terms "power" and "energy" are often used interchangeably. Unit 426 may average the power across a number of scaled samples and provide a measured power in each measurement period. A summer 428 may subtract the measured power from an adjusted setpoint provided by a setpoint adjustment unit 432 and may provide an error to a loop filter 430. Loop filter 430 may filter the error from summer 428 and provide the DAGC gain to multiplier 424. Loop filter 430 may reduce the DAGC gain if the measured power exceeds the adjusted setpoint and may increase the DAGC gain if the measured power is below the adjusted setpoint. Loop filter 430 may also provide filtering for the DAGC gain.

Multiplier 424, power computation unit 426, summer 428, and loop filter 430 form a DAGC loop that operates in the time domain prior to FFT unit 450. The DAGC loop adjusts the DAGC gain such that the average power of the scaled samples matches the adjusted setpoint provided by unit 432.

To combat saturation in the frequency domain, a saturation detector 460 may receive frequency-domain symbols from FFT unit 450 and may detect for saturation as described below. Saturation detector 460 may provide a saturation indicator that may indicate whether saturation is detected. In one design, the saturation indicator may comprise a single bit that may be set to a first value (e.g., '0') to indicate no saturation or to a second value (e.g., '1') to indicate saturation of the FFT output. In another design, the saturation indicator may comprise multiple bits that may indicate whether saturation is detected or the severity of detected saturation. For example, the saturation indicator may be set to a first value (e.g., '0') to indicate no saturation, to a second value (e.g., '1') to indicate mild saturation, to a third value (e.g., '2') to indicate moderate saturation, or to a fourth value (e.g., '3') to indicate severe saturation. Different corrective actions may be performed for different levels of saturation.

In the design shown in FIG. 4, setpoint adjustment unit 432 may receive the saturation indicator from saturation detector 460 as well as a nominal setpoint. The nominal setpoint may be selected to exploit the full dynamic range of FFT unit 450 regardless of the received power level at the antenna connector. In one design, unit 432 may provide the adjusted setpoint, which may be set as follows:

$$\text{Adjusted setpoint} = \begin{cases} \text{Nominal setpoint} & \text{if no saturation} \\ \text{Nominal setpoint} - \Delta & \text{if saturation} \end{cases} \quad \text{Eq (1)}$$

where $\Delta$ is the amount of reduction in the setpoint when saturation is detected. The setpoint and $\Delta$ are given in logarithmic units, e.g., decibels (dB), in equation (1).

In one design, $\Delta$ may be a single value that may be selected when a single-bit saturation indicator is set to a value (e.g., '1') to indicate saturation. For example, $\Delta$ may be equal to 6 dB, which may then result in the power of the input samples being reduced by a factor of four when saturation is detected. Other values may also be used for $\Delta$. In another design, $\Delta$ may be one of multiple possible values, which may be selected by a multi-bit saturation indicator. For example, $\Delta$ may be equal to a larger value (e.g., 6 dB) for severe saturation or a smaller value (e.g., 3 dB) for mild saturation.

In the design shown in equation (1), a smaller adjusted setpoint may be used when saturation is detected. The smaller adjusted setpoint may result in a smaller DAGC gain, which may then reduce the signal level of the scaled samples from multiplier 424. The smaller adjusted setpoint may be selected such that saturation in the FFT output can be avoided or mitigated.

As shown in FIG. 4, when saturation is detected, the smaller adjusted setpoint may result in a larger error from summer 428. The larger error may be filtered by loop filter 430 to obtain a smaller DAGC gain. The filtering by loop filter 430 may result in a delay from the time the setpoint is adjusted due to detected saturation to the time the DAGC gain is reduced to the desired value. In one design, a loop bandwidth adjustment unit 434 may also receive the saturation indicator and may increase the loop bandwidth of loop filter 430 (e.g., by reducing a time constant for loop filter 430) when saturation is detected. The wider loop bandwidth may reduce the DAGC response time and hence reduce the delay in obtaining the desired DAGC gain in order to quickly move out of the saturation scenario. In general, progressively wider loop bandwidth may result in progressively shorter delay. The loop bandwidth may be increased by a suitable amount to obtain the desired delay. For example, it may be desirable to reduce the delay to be less than the cyclic prefix length. This may ensure that the desired DAGC gain can be obtained prior to the next OFDM symbol or SC-FDMA symbol.

The setpoint may be reduced when saturation is detected. The smaller adjusted setpoint may be used until saturation is no longer detected, at which time the nominal setpoint may be used. The loop bandwidth may be increased when saturation is detected. The wider loop bandwidth may be used while saturation is detected. Alternatively, the wider loop bandwidth may be used for a predetermined time duration whenever the setpoint is changed.

Figure 5:
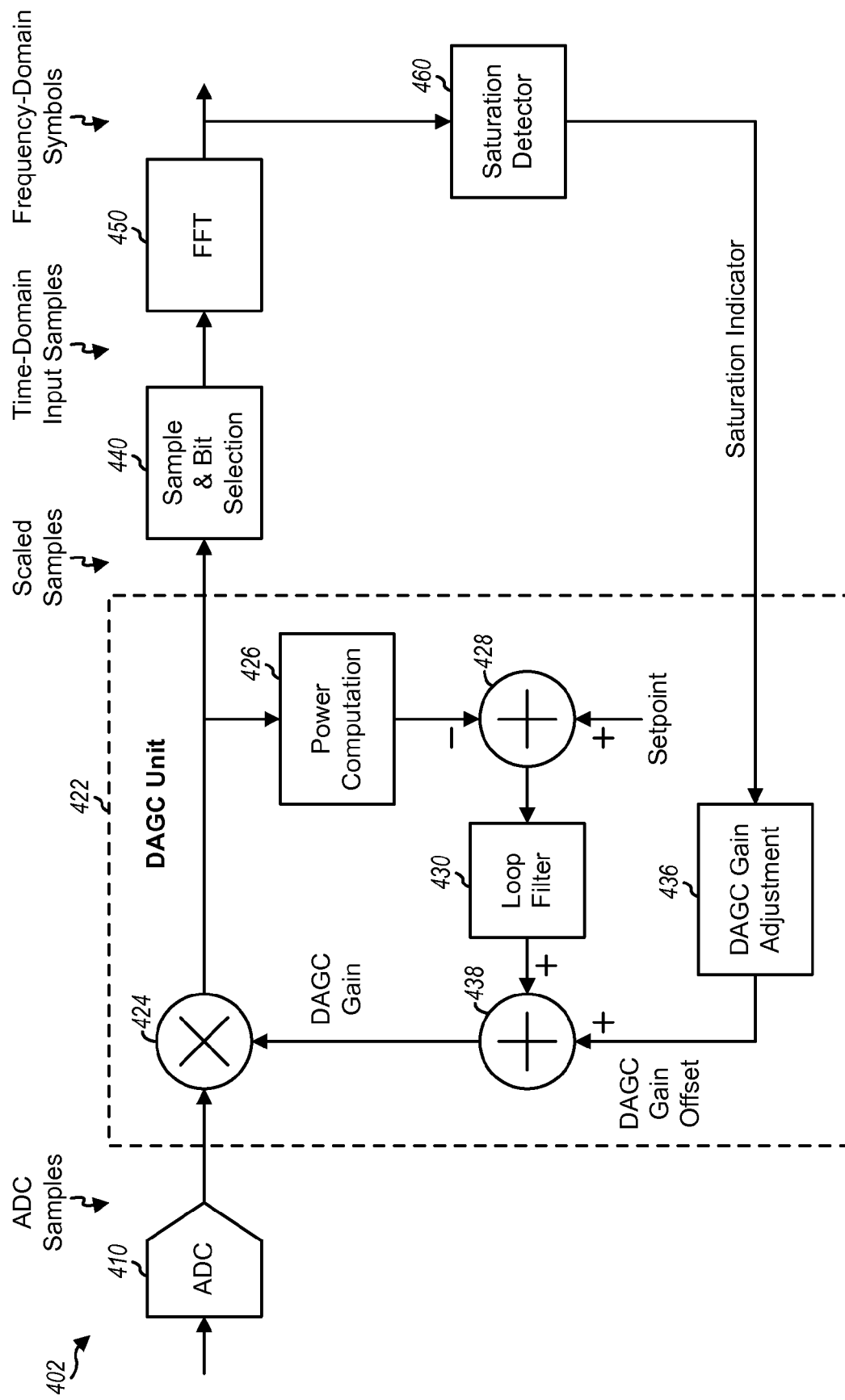
FIG. 5 shows another receiver with joint time-frequency AGC.

FIG. 5 shows a block diagram of a design of a receiver 402 with another DAGC unit 422 for joint time-frequency AGC. Within DAGC unit 422, multiplier 424 may multiply each ADC sample with the DAGC gain and provide a corresponding scaled sample. Power computation unit 426 may compute the power of each scaled sample, average the power across a number of scaled samples, and provide a measured power in each measurement period. Summer 428 may subtract the measured power from a setpoint and provide an error to loop filter 430. Loop filter 430 may filter the error from summer 428 and provide an initial DAGC gain to a multiplier 438.

To combat saturation in the frequency domain, saturation detector 460 may receive the frequency-domain symbols from FFT unit 450, detect for saturation, and provide a saturation indicator indicative of detected saturation. A DAGC gain adjustment unit 436 may receive the saturation indicator and may determine a DAGC gain offset based on the saturation indicator. Multiplier 438 may multiply the initial DAGC gain from loop filter 430 with the DAGC gain offset from unit 436 and may provide the DAGC gain to multiplier 424.

In one design, unit 436 may set the DAGC gain offset as follows:

$$DAGC \text{ gain offset} = \begin{cases} 0 & \text{if no saturation} \\ -\delta & \text{if saturation} \end{cases} \quad \text{Eq (2)}$$

where $\delta$ is the amount of reduction in the DAGC gain when saturation is detected.

In one design, $\delta$ may be a single value (e.g., 0.5) that may be selected when a single-bit saturation indicator is set to a value (e.g., '1') to indicate saturation. In another design, $\delta$ may be one of multiple possible values, which may be selected by a multi-bit saturation indicator. For example, $\delta$ may be a smaller value (e.g., 0.5) for severe saturation or a larger value (e.g., 0.75) for mild saturation.

In the design shown in equation (2), a negative DAGC gain offset may be used when saturation is detected. The negative DAGC gain offset may result in a smaller DAGC gain, which may then reduce the signal level of the scaled samples from multiplier 424. The DAGC gain offset may be selected such that saturation in the FFT output can be avoided or mitigated. As shown in FIG. 5, the smaller DAGC gain may be obtained quickly when saturation is detected since the DAGC gain offset is applied after loop filter 430. The smaller DAGC gain may be used until saturation is no longer detected, at which time the DAGC gain offset may be set to zero.

FIGS. 4 and 5 show designs in which the DAGC gain may be updated in linear unit. In another design, the DAGC gain may be updated in logarithm unit (e.g., dB). In this design, a linear-to-log converter may be placed between power computation unit 426 and summer 428, and a log-to-linear converter may be placed between multiplier 424 and loop filter 430 in FIG. 4 or between multipliers 424 and 438 in FIG. 5. Multiplier 438 may then be replaced with a summer.

In the designs shown in FIGS. 4 and 5, an extra feedback loop may be used to provide feedback information from the frequency domain to the DAGC unit operating in the time domain. The extra feedback loop may be placed at the FFT output and may serve the purposes of detecting high-power spectral components (e.g., above a certain threshold) and informing the time-domain DAGC unit of detected saturation. When the DAGC unit becomes aware that saturation is detected, it may promptly reduce the setpoint and/or the DAGC gain to combat possible saturation at the FFT output.

Saturation detector 460 in FIGS. 4 and 5 may detect for saturation in the frequency domain in various manners. In one design, saturation detector 460 may monitor the power spectral density at the FFT output relative to the system bandwidth. Saturation may be declared based on various criteria. In one design, saturation may be declared if the power of each of a particular number of subcarriers exceeds a given threshold. In another design, saturation may be declared if at least one most significant bit (MSB) of a frequency-domain symbol in each of a particular number of subcarriers is set to one. For example, one MSB being set to '1' may be used to detect for power exceeding 50% of maximum power, two MSBs being set to '1' may be used to detect for power exceeding 75% of maximum power, three MSBs being set to '1' may be used to detect for power exceeding 87.5% of maximum power, etc. In general, saturation may be declared based on any number of subcarriers with large signal level exceeding a threshold. Furthermore, any suitable threshold may be used to quantify a signal level as being large. Different levels of saturation may be defined with different thresholds and/or different numbers of subcarriers with large signal level. For example, mild saturation may be declared if at least N1 subcarriers have signal level exceeding a TH1 threshold, moderate saturation may be declared if at least N2 subcarriers have signal level exceeding a TH2 threshold, and severe saturation may be declared if at least N3 subcarriers have signal level exceeding a TH3 threshold, where N1<N2<N3 and/or TH1<TH2<TH3. Saturation as well as different levels of saturation may also be detected in other manners.

Regardless of which mechanism is used to reduce the DAGC gain, the feedback information from the FFT output transforms the DAGC from a time-domain only AGC to a joint time-frequency AGC. This may provide robust performance across a wide range of operating scenarios that may be encountered in a wireless system.

Saturation may be detected in the frequency domain after transforming a block of input samples from the time domain to the frequency domain. In one design, if saturation is detected, then the frequency-domain symbols may be provided to a receive processor for subsequent processing even though these frequency-domain symbols might be saturated. In another design, the frequency-domain symbols may be discarded if saturation is detected. A data packet may be sent in multiple OFDM symbols or multiple SC-FDMA symbols. The data packet may be recovered based on frequency-domain symbols from subsequent OFDM symbols or SC-FDMA symbols, which should not experience saturation due to reduction of the DAGC gain. In yet another design, only frequency-domain symbols that are saturated (e.g., with power exceeding a threshold) may be discarded, and remaining frequency-domain symbols may be provided for subsequent processing. In yet another design, the block of input samples may be re-scaled by the DAGC unit with a lower DAGC gain, and the re-scaled samples may be re-applied to the FFT unit. The block of input samples and/or the corresponding frequency-domain symbols may also be processed in other manners if saturation is detected.

In the designs described above, the DAGC gain may be adjusted based on detection of saturation in the frequency domain. The DAGC gain may be applied to the samples from the ADC to obtain time-domain input samples for the FFT. In another design, an analog gain may be adjusted based on detection of saturation in the frequency domain. The analog gain may be applied prior to the ADC. For example, the gain of one or more variable gain amplifiers (VGAs) prior to the ADC may be adjusted by the analog gain. In general, the DAGC gain and/or analog gain may be adjusted based on detection of saturation. The analog gain may be applied prior to the ADC, and the DAGC gain may be applied after the ADC.

The techniques described herein may improve robustness and accuracy of dynamic signal scaling in the receiver for OFDM-based and SC-FDMA-based systems in which samples are transformed to the frequency domain at the receiver. The techniques may be implemented with (i) a simple feedback loop that inter-connects the FFT output and the DAGC and (ii) few additional circuit blocks of modest complexity.

FIG. 6 shows a design of a process 600 for performing AGC for wireless communication. Process 600 may be performed by a receiver, which may be part of a UE, a base station, or some other entity. The receiver may transform time-domain samples with an FFT to obtain frequency-domain symbols (block 612). The FFT may comprise any transform that can convert data from time domain to frequency domain. The frequency-domain symbols may be for an OFDM symbol, an SC-FDMA symbol, etc. The receiver may detect for saturation of the frequency-domain symbols from the FFT (block 614). The receiver may adjust a gain based on whether saturation is detected and may apply the gain prior to the FFT (block 616). In one design, which is shown in FIG. 6, the receiver may scale digital samples from an ADC with the gain to obtain the time-domain samples (block 618). In another design, which is not shown in FIG. 6, the receiver may apply the gain to an analog signal prior to the ADC.

In one design of block 616, the receiver may adjust the gain with DAGC implemented prior to the FFT. The receiver may vary the adjustment of the gain by the DAGC when saturation is detected. Feedback information indicative of whether saturation is detected may be provided from the output of the FFT to the DAGC and may be used to vary the adjustment of the gain by the DAGC.

In one design of the DAGC, which is shown in FIG. 4, the receiver may use a nominal value for a setpoint if saturation is not detected and may reduce the setpoint if saturation is detected. The receiver may measure the power of the time-domain samples and may determine the gain based on the setpoint and the measured power. The receiver may determine an error between the measured power and the setpoint and may filter the error (e.g., with a loop filter) to obtain the gain. The receiver may use a nominal bandwidth for the filtering if saturation is not detected and may increase the bandwidth if saturation is detected. In one design, the receiver may reduce the setpoint by a predetermined amount if saturation is detected. In another design, the receiver may reduce the setpoint by a variable amount determined based on the severity of the saturation.

In another design of the DAGC, which is shown in FIG. 5, the receiver may measure the power of the time-domain samples and may determine an initial gain based on the setpoint and the measured power. The receiver may determine a gain offset based on whether saturation is detected. The receiver may then determine the gain based on the initial gain and the gain offset.

In one design of block 614, the receiver may declare saturation if a particular number of frequency-domain symbols have power exceeding a threshold. In another design, the receiver may declare saturation based on at least one MSB of the frequency-domain symbols from the FFT. The receiver may generate a saturation indicator indicating whether saturation is detected and may provide the saturation indication to the DAGC. In one design, the saturation indicator may comprise a single bit that may be set to a first value to indicate no saturation or to a second value to indicate saturation. In another design, the saturation indicator may indicate no saturation or one of multiple saturation levels. In this design, the receiver may adjust the gain by different amounts for different saturation levels.

FIG. 7 shows a design of an apparatus 700 for performing AGC for wireless communication. Apparatus 700 includes a module 712 to transform time-domain samples with an FFT to obtain frequency-domain symbols, a module 714 to detect for saturation of the frequency-domain symbols from the FFT, and a module 716 to adjust a gain applied prior to the FFT based on whether saturation is detected. In one design, which is shown in FIG. 7, the apparatus may further include a module 718 to scale digital samples from an ADC with the gain to obtain the time-domain samples. In another design, which is not shown in FIG. 7, the apparatus may further include a module to apply the gain to an analog signal prior to the ADC. The modules in FIG. 7 may be implemented by any of the processors and modules in FIG. 1.

The modules in FIG. 7 may comprise processors, electronics devices, hardware devices, electronics components, logical circuits, memories, software codes, firmware codes, etc., or any combination thereof.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method of performing automatic gain control (AGC) for wireless communication, comprising:
   transforming time-domain samples with a fast Fourier transform (FFT) to obtain frequency-domain symbols;
   detecting for saturation of the frequency-domain symbols from the FFT; and
   adjusting a gain applied prior to the FFT based on whether saturation is detected,
   wherein, the adjusting the gain comprises:
      measuring power of the time-domain samples;
      reducing a setpoint if saturation is detected, the setpoint determining an average power of the time-domain samples; and
      determining the gain based on the setpoint and the measured power.

2. The method of claim 1, further comprising:
   scaling digital samples from an analog-to-digital converter (ADC) with the gain to obtain the time-domain samples.

3. The method of claim 1, further comprising:
   applying the gain to an analog signal prior to an analog-to-digital converter (ADC).

4. The method of claim 1, wherein the adjusting the gain comprises:
   adjusting the gain with digital AGC (DAGC) implemented prior to the FFT; and varying adjustment of the gain by the DAGC when saturation is detected.

5. The method of claim 4, further comprising:
   providing feedback information from the output of the FFT to the DAGC, the feedback information indicating whether saturation is detected.

6. The method of claim 1, wherein the reducing the setpoint comprises reducing the setpoint by a predetermined amount if saturation is detected.

7. The method of claim 1, wherein the reducing the setpoint comprises reducing the setpoint by a variable amount determined based on severity of the saturation.

8. The method of claim 1, wherein the determining the gain comprises:
   determining an error between the measured power and the setpoint;
   filtering the error to obtain the gain; and
   increasing bandwidth of the filtering if saturation is detected.

9. A method of performing automatic gain control (AGC) for wireless communication, comprising:
   transforming time-domain samples with a fast Fourier transform (FFT) to obtain frequency-domain symbols;
   detecting for saturation of the frequency-domain symbols from the FFT; and
   adjusting a gain applied prior to the FFT based on whether saturation is detected,
   wherein, the adjusting the gain comprises:
   measuring power of the time-domain samples;
   reducing a setpoint if saturation is detected, the setpoint determining an average power of the time-domain samples;
   determining an initial gain based on the setpoint and the measured power;
   determining a gain offset based on whether saturation is detected; and
   determining the gain based on the initial gain and the gain offset.

10. The method of claim 1, wherein the detecting for saturation comprises declaring saturation if a particular number of frequency-domain symbols have power exceeding a threshold.

11. The method of claim 1, wherein the detecting for saturation comprises detecting for saturation based on at least one most significant bit of the frequency-domain symbols.

12. The method of claim 1, further comprising:
   generating a saturation indicator indicating whether saturation is detected, the saturation indicator being used to adjust the gain.

13. The method of claim 12, wherein the saturation indicator comprises a single bit set to a first value to indicate no saturation or to a second value to indicate saturation.

14. The method of claim 12, wherein the saturation indicator indicates no saturation or one of multiple saturation levels, and wherein the gain is adjusted by different amounts for different saturation levels.

15. The method of claim 1, wherein the frequency-domain symbols are for an orthogonal frequency division multiplexing (OFDM) symbol or a single-carrier frequency division multiplex access (SC-FDMA) symbol.

16. An apparatus for performing automatic gain control (AGC) for wireless communication, comprising:
   means for transforming time-domain samples with a fast Fourier transform (FFT) to obtain frequency-domain symbols;
   means for detecting for saturation of the frequency-domain symbols from the FFT; and
   means for adjusting a gain applied prior to the FFT based on whether saturation is detected,
   wherein, the means for adjusting the gain comprises:
      means for measuring power of the time-domain samples;
      means for reducing a setpoint if saturation is detected, the setpoint determining an average power of the time-domain samples; and
      means for determining the gain based on the setpoint and the measured power.

17. The apparatus of claim 16, further comprising:
   means for scaling digital samples from an analog-to-digital converter (ADC) with the gain to obtain the time-domain samples.

18. The apparatus of claim 16, wherein the means for adjusting the gain comprises:
   means for adjusting the gain with digital AGC (DAGC) implemented prior to the FFT; and
   means for varying adjustment of the gain by the DAGC when saturation is detected.

19. The apparatus of claim 16, wherein the means for determining the gain comprises:
   means for determining an error between the measured power and the setpoint;
   means for filtering the error to obtain the gain; and
   means for increasing bandwidth of the filtering if saturation is detected.

20. An apparatus for performing automatic gain control (AGC) for wireless communication, comprising:
   means for transforming time-domain samples with a fast Fourier transform (FFT) to obtain frequency-domain symbols;
   means for detecting for saturation of the frequency-domain symbols from the FFT; and
   means for adjusting a gain applied prior to the FFT based on whether saturation is detected;

wherein, the means for adjusting the gain comprises:
means for measuring power of the time-domain samples;
means for reducing a setpoint if saturation is detected, the setpoint determining an average power of the time-domain samples;
means for determining an initial gain based on the setpoint and the measured power;
means for determining a gain offset based on whether saturation is detected; and
means for determining the gain based on the initial gain and the gain offset.

21. The apparatus of claim 16, wherein the means for detecting for saturation comprises means for declaring saturation if a particular number of frequency-domain symbols have power exceeding a threshold.

22. An apparatus for performing automatic gain control (AGC) for wireless communication, comprising:
at least one processor configured to transform time-domain samples with a fast Fourier transform (FFT) to obtain frequency-domain symbols, to detect for saturation of the frequency-domain symbols from the FFT, and to adjust a gain applied prior to the FFT based on whether saturation is detected by:
measuring power of the time-domain samples;
reducing a setpoint if saturation is detected, the setpoint determining an average power of the time-domain samples; and
determining the gain based on the setpoint and the measured power.

23. The apparatus of claim 22, wherein the at least one processor is configured to scale digital samples from an analog-to-digital converter (ADC) with the gain to obtain the time-domain samples.

24. The apparatus of claim 22, wherein the at least one processor is configured to adjust the gain with digital AGC (DAGC) implemented prior to the FFT, and to vary adjustment of the gain by the DAGC when saturation is detected.

25. The apparatus of claim 22, wherein the at least one processor is configured to determine an error between the measured power and the setpoint, to filter the error to obtain the gain, and to increase bandwidth of the filtering if saturation is detected.

26. An apparatus for performing automatic gain control (AGC) for wireless communication, comprising:
at least one processor configured to transform time-domain samples with a fast Fourier transform (FFT) to obtain frequency-domain symbols, to detect for saturation of the frequency-domain symbols from the FFT, and to adjust a gain applied prior to the FFT based on whether saturation is detected by:
measuring power of the time-domain samples;
reducing a setpoint if saturation is detected, the setpoint determining an average power of the time-domain samples;
determining an initial gain based on the setpoint and the measured power;
determining a gain offset based on whether saturation is detected; and
determining the gain based on the initial gain and the gain offset.

27. The apparatus of claim 22, wherein the at least one processor is configured to declare saturation if a particular number of frequency-domain symbols have power exceeding a threshold.

28. A computer program product, comprising:
a non-transitory computer-readable medium comprising:
code for causing at least one computer to transform time-domain samples with a fast Fourier transform (FFT) to obtain frequency-domain symbols;
code for causing the at least one computer to detect for saturation of the frequency-domain symbols from the FFT; and
code for causing the at least one computer to adjust a gain applied prior to the FFT based on whether saturation is detected,
wherein adjusting the gain comprises:
measuring power of the time-domain samples;
reducing a setpoint if saturation is detected, the setpoint determining an average power of the time-domain samples; and
determining the gain based on the setpoint and the measured power.

* * * * *